(12) United States Patent
Csato et al.

(10) Patent No.: US 12,125,670 B2
(45) Date of Patent: Oct. 22, 2024

(54) DEVICE AND METHOD FOR IMPLANTING PARTICLES INTO A SUBSTRATE

(71) Applicant: MI2-FACTORY GMBH, Jena (DE)

(72) Inventors: Constantin Csato, Stammbach (DE); Florian Krippendorf, Jena (DE)

(73) Assignee: MI2-FACTORY GMBH, Jena (DE)

( * ) Notice: Subject to any disclaimer, the term of this patent is extended or adjusted under 35 U.S.C. 154(b) by 469 days.

(21) Appl. No.: 17/610,811

(22) PCT Filed: May 14, 2020

(86) PCT No.: PCT/EP2020/063555
§ 371 (c)(1),
(2) Date: Nov. 12, 2021

(87) PCT Pub. No.: WO2020/229638
PCT Pub. Date: Nov. 19, 2020

(65) Prior Publication Data
US 2022/0199362 A1 Jun. 23, 2022

(30) Foreign Application Priority Data
May 15, 2019 (DE) ............ 10 2019 112 773.4

(51) Int. Cl.
*H01J 37/317* (2006.01)
*H01J 37/05* (2006.01)
(Continued)

(52) U.S. Cl.
CPC .......... *H01J 37/3171* (2013.01); *H01J 37/05* (2013.01); *H01J 37/08* (2013.01);
(Continued)

(58) Field of Classification Search
CPC ........ H01J 37/3171; H01J 37/05; H01J 37/08; H01L 21/26513; H01L 21/265; H01L 21/425
See application file for complete search history.

(56) References Cited

U.S. PATENT DOCUMENTS

| 4,278,475 A | 7/1981 | Bartko |
| 10,847,338 B2 | 11/2020 | Krippendorf |

(Continued)

FOREIGN PATENT DOCUMENTS

| DE | 102005061663 A1 | 7/2007 |
| DE | 102011075350 A1 | 11/2012 |

(Continued)

OTHER PUBLICATIONS

International Search Report Dated Nov. 9, 2020, 3 Pages.
(Continued)

*Primary Examiner* — Walter H Swanson
(74) *Attorney, Agent, or Firm* — LUCAS & MERCANTI, LLP

(57) ABSTRACT

A device for implanting particles in a substrate comprises a particle source and a particle accelerator for generating an ion beam of positively charged ions. The device also comprises a substrate holder and an energy filter, which is arranged between the particle accelerator and the substrate holder. The energy filter is a microstructured membrane with a predefined structural profile for setting a dopant depth profile and/or a defect depth profile produced in the substrate by the implantation. The device also comprises at least one passive braking element for the ion beam. The at least one passive braking element is arranged between the particle accelerator and the substrate holder and is spaced apart from the energy filter.

17 Claims, 5 Drawing Sheets

(51) Int. Cl.
*H01J 37/08* (2006.01)
*H01L 21/265* (2006.01)

(52) U.S. Cl.
CPC ...... *H01L 21/26513* (2013.01); *H01J 2237/0473* (2013.01); *H01J 2237/0475* (2013.01); *H01J 2237/057* (2013.01)

(56) References Cited

U.S. PATENT DOCUMENTS

| | | | |
|---|---|---|---|
| 11,056,309 | B2 | 7/2021 | Krippendorf |
| 2008/0128641 | A1 | 6/2008 | Henley |
| 2013/0037475 | A1 | 2/2013 | Freter |
| 2017/0352519 | A1* | 12/2017 | Rupp ............ H01J 37/05 |
| 2018/0350557 | A1 | 12/2018 | Matsushita |

FOREIGN PATENT DOCUMENTS

| | | |
|---|---|---|
| DE | 102016106119 A1 | 10/2017 |
| DE | 102016122791 B3 | 5/2018 |
| EP | 0014516 A1 | 8/1980 |
| JP | 2007523440 A | 8/2007 |
| JP | 2013222893 A | 10/2013 |
| WO | 2005078758 A1 | 8/2005 |
| WO | 2017174597 A1 | 10/2017 |

OTHER PUBLICATIONS

Citation of references considered in the German application DE 10 2019 112 773.4, 1 Page.

Taccetti, N.; Giuntini, L.; Casini, G.; Stefanini, A.A.; Chiari, M.; Fedi, M.E.; Mandoo, P.A.: The pulsed beam facility at the 3 MV Van de Graaff accelerator in Florence: Overview and examples of applications. In: Nucl. Instrum. Meth. Phys. Res. B, vol. 188, 2002, S. 255-260.

Thieberger Pet al: "Novel high-energy ion implantation facility using a 15?MV Tandem Van de Graaff accelerator", Nuclear Instruments & Methods in Physics Research. Section B: Beam Interactions With Materials and Atoms, Bd. 442, Jan. 17, 2019 (Jan. 17, 2019), Seiten 36-40, XP085593505, ISSN: 0168-583X.

Japanese Patent Office issued an Office Action on Nov. 28, 2023, 2 pages.

* cited by examiner

DEVICE AND METHOD FOR IMPLANTING PARTICLES INTO A SUBSTRATE

CROSS-REFERENCE TO RELATED APPLICATIONS

The present application is a 371 of International application PCT/EP2020/063555, filed May 14, 2020, which claims priority of DE 10 2019 112 773.4, filed May 15, 2019, the priority of these applications is hereby claimed, and these applications are incorporated herein by reference.

BACKGROUND OF THE INVENTION

The present invention relates to a device and to a method for implanting particles in a substrate.

High-energy ion beams are used to modify material properties such as the conductivity or carrier lifetime of semiconductor materials. Typical primary energies of the ions are more than 500 keV, and typical semiconductor materials are silicon, silicon carbide, gallium arsenide, cadmium telluride, zinc selenide, gallium nitride, etc. It is also possible, however, to use high-energy ion beams to modify the properties of non-semiconductors such as quartz glass, lithium niobate, potassium titanyl phosphate, or even plastics such as PMMA.

In recent years, a new high-energy implantation method, the so-called energy-filtered implantation, has become established in the market. In commercially oriented microengineering production processes, the idea is to use ion implantation, either masked or unmasked, to produce dopings or point defects in semiconductor or non-semiconductor materials with predefined depth profiles ranging in depth from a few nanometers to several tens of micrometers. To realize these dopant depth profiles, so-called energy filters for ion implantation are used.

In these types of systems, the ions produced in special ion sources are brought up to the required primary energy by complicated high-energy accelerators. The systems are usually highly complex and take up a large amount of space. This leads to high costs for the construction of the necessary buildings and to high purchase prices for the accelerator machinery. Adjusting the energy to the correct value for each type of ion beam is also complicated and is often difficult to reproduce.

In the electrostatic tandem accelerators or "tandetron" accelerators used up to now in most cases for high-energy wafer implantation, furthermore, negative ions must be injected on the low-energy side. This has the effect of limiting the current available for some elements such as aluminum.

SUMMARY OF THE INVENTION

It is an object of the invention to provide a device and a method for implanting particles in a substrate which are especially compact and reliable.

According to a first aspect of the present invention, the device for implanting particles in a substrate comprises a particle source and a particle accelerator for generating an ion beam of positively-charged ions, and a substrate holder. The device also comprises an energy filter, which is arranged between the particle accelerator and the substrate holder, wherein the energy filter is a microstructured membrane with a predefined structural profile for adjusting the dopant depth profile and/or defect depth profile produced in the substrate by the implantation. The device also comprises at least one passive braking element for the ion beam, wherein the at least one passive braking element is arranged between the particle accelerator and the substrate holder and spaced apart from the energy filter.

With this configuration, it is possible to withdraw energy effectively from the ion beam and thus to arrive at the desired energy for the implantation of the particles in the substrate.

In a preferred embodiment, the passive braking element is a planar membrane.

The thickness of the planar membrane is preferably between 0.5 µm and 100 µm, more preferably between 2 µm and 30 µm, and especially preferably between 4 µm and 15 µm.

The material of the planar membrane is preferably selected from one of the following materials: silicon, tungsten, carbon, and titanium. These materials are especially suitable for achieving a high degree of energy dissipation and for obtaining a membrane with high mechanical stability. Compound materials are also conceivable, such as those containing lead for obtaining a high braking efficiency, and multi-layer materials made up of layers with similar thermal expansion properties.

In a preferred embodiment, the passive braking element is arranged between the particle accelerator and the energy filter. This ensures that only the ion beam of reduced energy strikes the energy filter and thus only the minimum necessary power is dissipated in the energy filter. The distance between the passive braking element and the energy filter is preferably between 0.5 cm and 50 cm, more preferably between 0.7 cm and 10 cm, and especially preferably between 1 cm and 2 cm.

The passive braking element is preferably supported pivotably or slidably. This makes it possible to move the passive braking element into the ion beam or out of the ion beam at any desired time. Especially when a plurality of passive braking elements is present, it is thus easy to adjust the desired energy reduction of the ion beam.

According to another aspect of the invention, a method for implanting particles in a substrate with the above-described device comprises the following steps:
  generating an ion beam of positively charged ions by means of the particle source and the particle accelerator; and
  irradiating the substrate held by the substrate holder with the ion beam under interposition of the at least one passive braking element and the energy filter.

In this method, it is especially preferred that the particle accelerator, because of the way it is configured, be able to deliver only one fixed energy per nucleon for each ion species. It is also possible that the particle accelerator, because of the way it is configured, only delivers ions in the energy range of 1-50 MeV, wherein, because of the way the accelerator is configured, fewer than ten, preferably no more than five, settable energies of the ion beam are possible. The energy of the ion beam striking the substrate is then varied through the appropriate selection of the number of braking elements through which the ion beam passes after leaving the particle accelerator, and the appropriate selection of the properties of the braking elements, such as their material and/or thickness. With this configuration, the production costs and dimensions of the particle accelerator can be reduced to a minimum. In addition, the setting of the energy of the ion beam by means of the above-cited selections can be achieved in an especially reproducible and reliable manner for all of the desired ion beam energies. The problems such as the high cost of the control engineering, which is usually encountered in cases where the energy of the ion beam in the accelerator can be freely varied, are also eliminated.

In a preferred embodiment, furthermore, multiple copies of at least one of the braking elements are provided, and these identical braking elements are introduced, preferably rotated, alternately into the ion beamline. In this way, the radiation exposure and heating of each individual identical braking element can be reduced. An advantageous way of achieving this is to mount the identical braking elements on the same holder and to rotate the holder in a plane perpendicular to the ion beam.

In addition, several identical energy filters can also be provided, which are introduced into the path of the ion beam, wherein the energy filters and the braking elements are preferably driven by the same rotational mechanism. The radiation exposure and heating of an individual energy filter are thus reduced. The holders of the braking elements and energy filters then lie in at least two planes arranged one behind the other in the direction of the ion beam, wherein the braking elements are preferably arranged in the first plane and the energy filters in the second plane. The braking elements thus rotate in the first plane and the energy filters rotate in the second plane.

The above described alternating use of identical braking elements and possibly of energy filters also makes it possible to use, as the particle accelerator, a high-frequency linear accelerator or a cyclotron which generates a pulsed ion beam with an energy of 0.3-3.0 MeV/nucleon. Because they are used by turns, the individual braking elements and/or energy filters can allow even an ion beam of such high-energy pulses to pass through without suffering damage or overheating. The timing and duration of the alternation of the braking elements and/or energy filters are preferably adapted to the timing and pulse duty factor of the pulsed ion beam. It is also conceivable, however, that a continuous ion beam in the same energy range could be used.

According to another aspect of the present invention, a method for implanting particles in a substrate comprises the steps of:
  providing a device with a particle source and a particle accelerator, a substrate holder, and an energy filter, which is arranged between the particle accelerator and the substrate holder, wherein the energy filter is a microstructured membrane with a predefined structural profile for adjusting a dopant depth profile and/or a defect depth profile produced in the substrate by the implantation;
  generating an ion beam of positively charged ions by means of the particle source and the particle accelerator; and
  irradiating the substrate held by the substrate holder with the ion beam under interposition of the energy filter.

In this embodiment, the particle accelerator is a high-frequency linear accelerator or a cyclotron, which generates a pulsed or a continuous ion beam with an energy of 0.3-3.0 MeV/nucleon, preferably of 0.5-3.0 MeV/nucleon, more preferably of 1.0-2.0 MeV/nucleon, and especially preferably of 1.3-1.7 MeV/nucleon. The total energy of the ion beam is preferably between 1 and 50 MeV, especially preferably between 4 and 40 MeV.

The particle accelerator, because of the way it is configured, can preferably deliver only one fixed energy per nucleon for each ion species. It is also possible that the particle accelerator, because of the way it is configured, could only deliver ions in the energy range of 1-50 MeV, wherein, because of the way the particle accelerator is configured, fewer than ten settable energies of the ion beam (before it strikes the braking element or the energy filter) are possible. In this way, the complicated effort involved in fine-tuning too many different energies of the ion beam is eliminated, which leads to better reproducibility and significantly reduced costs.

In a preferred embodiment, the duty factor of the pulsed ion beam is in a range from 1:20 to 1:5, preferably from 1:12 to 1:8.

It is especially preferred that the energy of the ion beam striking the substrate be varied by the use of an appropriate selection of the number of braking element(s) through which the ion beam passes after leaving the particle accelerator, and an appropriate selection of the properties of the braking element(s), such as their material and/or thickness. Thus the energy of the ion beam can be reduced in an especially precise and reproducible manner to a desired target value.

The ion beam is preferably spread out before it strikes the braking element(s). As a result, the effective area which the ion beam strikes is increased, and the impinging current density is decreased. This measure can be used together with the above described variation of the energy by appropriate selection of the number of the braking element(s) and of their material and/or thickness.

It is also preferred that multiple copies of at least one braking element be provided and that these identical copies be introduced into the beamline in alternation and/or that several identical energy filters be provided, which are introduced into the beamline in alternation. The radiation exposure and heating of the individual energy filters and/or braking elements are thus reduced.

In a preferred embodiment, the particle source makes available positive ions. This makes it easier to arrive at the desired level of current for most ion species.

DETAILED DESCRIPTION OF SPECIFIC EMBODIMENTS

Figure 1:
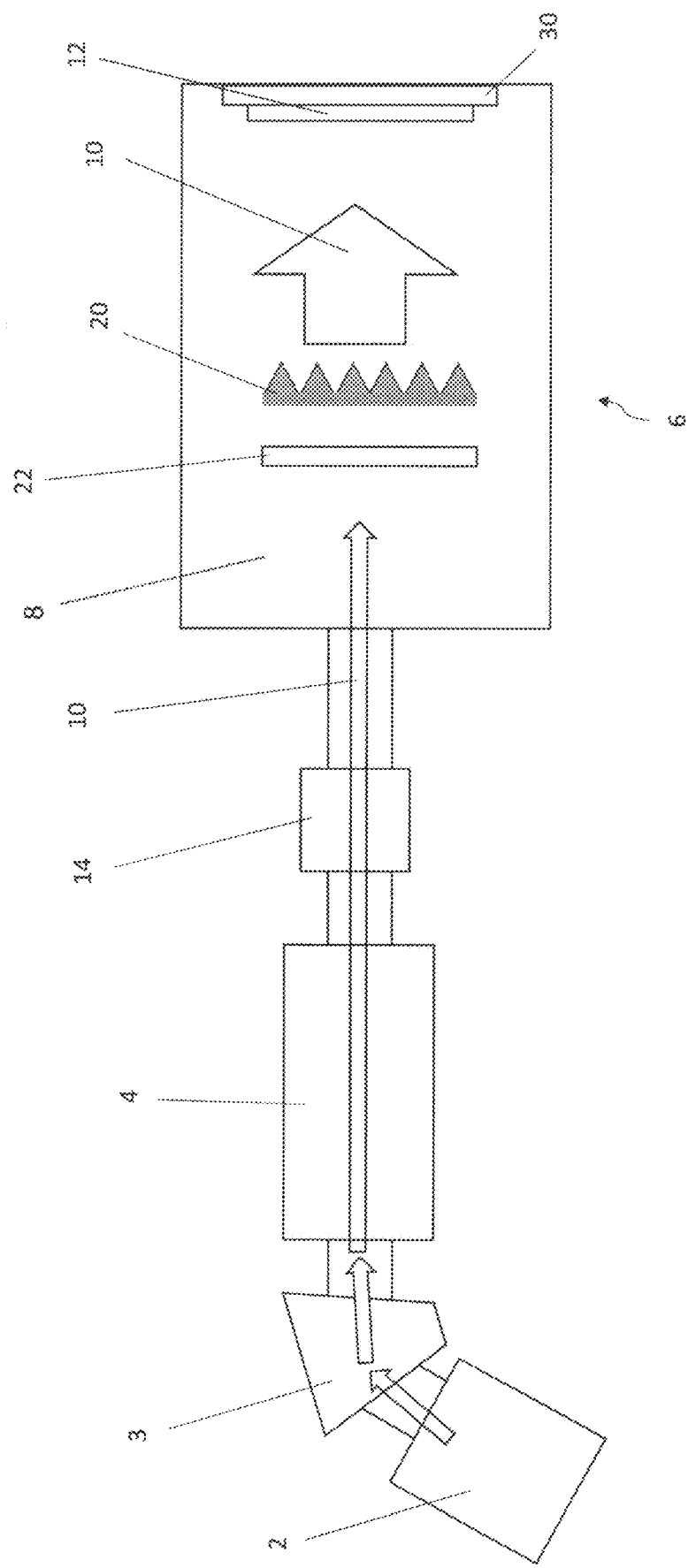
FIG. 1 is a schematic, cross-sectional view of a device according to the invention for implanting particles in a substrate.

The device for implanting particles in a substrate shown in FIG. 1 comprises a particle source 2, a particle accelerator 4, and an end station 6 with an irradiation chamber 8. A high vacuum is usually present in the irradiation chamber 8. A substrate 12 to be doped is mounted in a substrate holder 30 in the irradiation chamber 8.

The material of the substrate 12 is preferably silicon carbide (SiC). It is also possible, however, to consider other semiconductor materials such as silicon, gallium arsenide, cadmium telluride, zinc selenide, gallium nitride, etc. Also conceivable as a material for the substrate 12 are nonsemiconducting materials such as quartz glass, lithium niobate, potassium titanyl phosphate, or even plastics such as PMMA. The substrate 12 is preferably configured as a wafer.

Ions with preferably a positive charge are generated in the particle source 2. The desired ion species is selected by the analysis magnet 3; and then the positively charged ions are accelerated by the particle accelerator 4, as a result of which the accelerated ion beam 10 is formed. The ions of the ion beam 10 are preferably aluminum, nitrogen, hydrogen, helium, boron, phosphorus, carbon, arsenic, or vanadium ions.

The particle accelerator 4 is preferably a high-frequency linear accelerator, in which the ions are accelerated by means of high-frequency fields. Alternatively, the particle accelerator 4 can also be realized as a cyclotron or as an electrostatic accelerator such as a tandem accelerator, a tandetron accelerator, or a single-ended electrostatic accelerator. In the embodiment as an electrostatic tandetron, negative ions are generated in the particle source 2 first, after which they are accelerated, charge-reversed on a high-voltage terminal, and finally accelerated again in a manner similar to that described above.

It is especially preferred that the particle accelerator 4 be configured as a high-frequency linear accelerator of simple design or as a cyclotron, which can accelerate the ion beam 10 only to one fixed energy per nucleon. Because of the way the particle accelerator is configured, the control unit of the high-frequency linear accelerator or cyclotron cannot change the energy per nucleon. Instead, the control unit serves only to control the parameters necessary for the operation of the system. It is also conceivable that, because of the way the accelerator is designed, only fewer than ten, preferably no more than five, settable energies of the ion beam 10 are possible. Thus the complexity of the control technology in the particle accelerator 4 is considerably reduced in comparison to a free variation of the energy of the ion beam delivered by the particle accelerator.

Because of the way it is configured, the high-frequency linear accelerator or the cyclotron preferably delivers a pulsed ion beam 10 of positively charged ions with an energy of 0.3-3.0 MeV/nucleon, preferably of 0.5-3.0 MeV/nucleon, more preferably of 1.0-2.0 MeV/nucleon, especially preferably of 1.3-1.7 MeV/nucleon. The ion beam 10 thus generated can be described by a duty factor of the ion beam within a time window. For example, the duty factor (on:off) of the ion beam can be between 1:20 and 1:5, preferably between 1:12 and 1:8.

A pulse duty factor of 1:10 is explained now by way of example. Because, in this case, only 10% of the time window is available for the effective irradiation, it is necessary, for an ion beam pulsed in this way, to make available a current intensity of 100 µA within the pulse when the object is to achieve an average ion current of 10 µA.

The frequency of the pulses of the ion beam 10 is between 1 Hz and 2 kHz, preferably between 3 Hz and 500 Hz, and especially preferably between 7 Hz and 200 Hz.

The ion beam 10 can also be continuous at the same energy.

The high-energy ion beam 10 is usually formed in an ion lens 14 before entering the end station 6 and is then guided into the irradiation chamber 8. There the energy of the ion beam 10 is spread out by an energy filter 20 and then strikes the substrate 12 to be irradiated.

Figure 4:
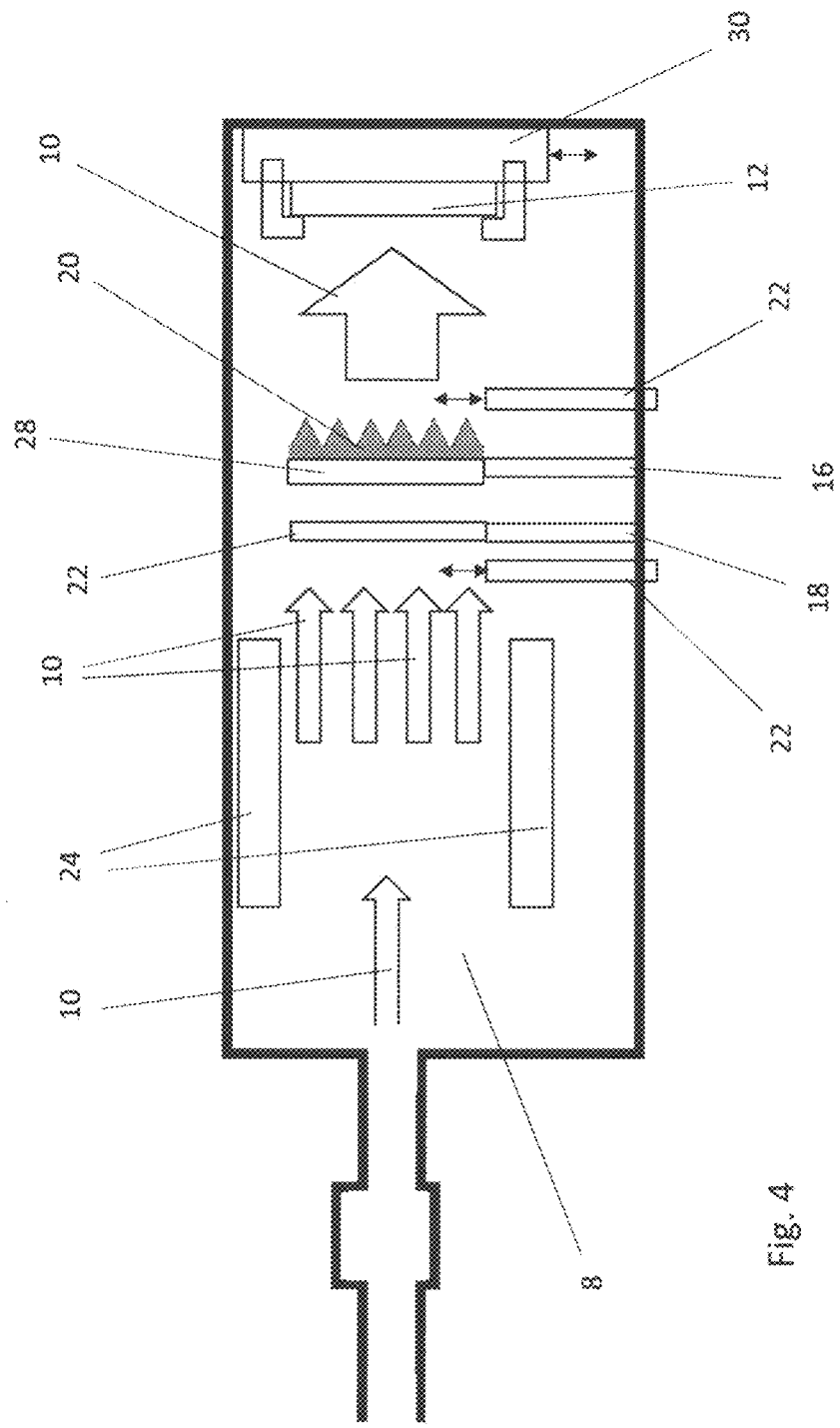
FIG. 4 is a schematic, cross-sectional view of an alternative embodiment of the device according to the invention for implanting particles in substrate.
Figure 5:
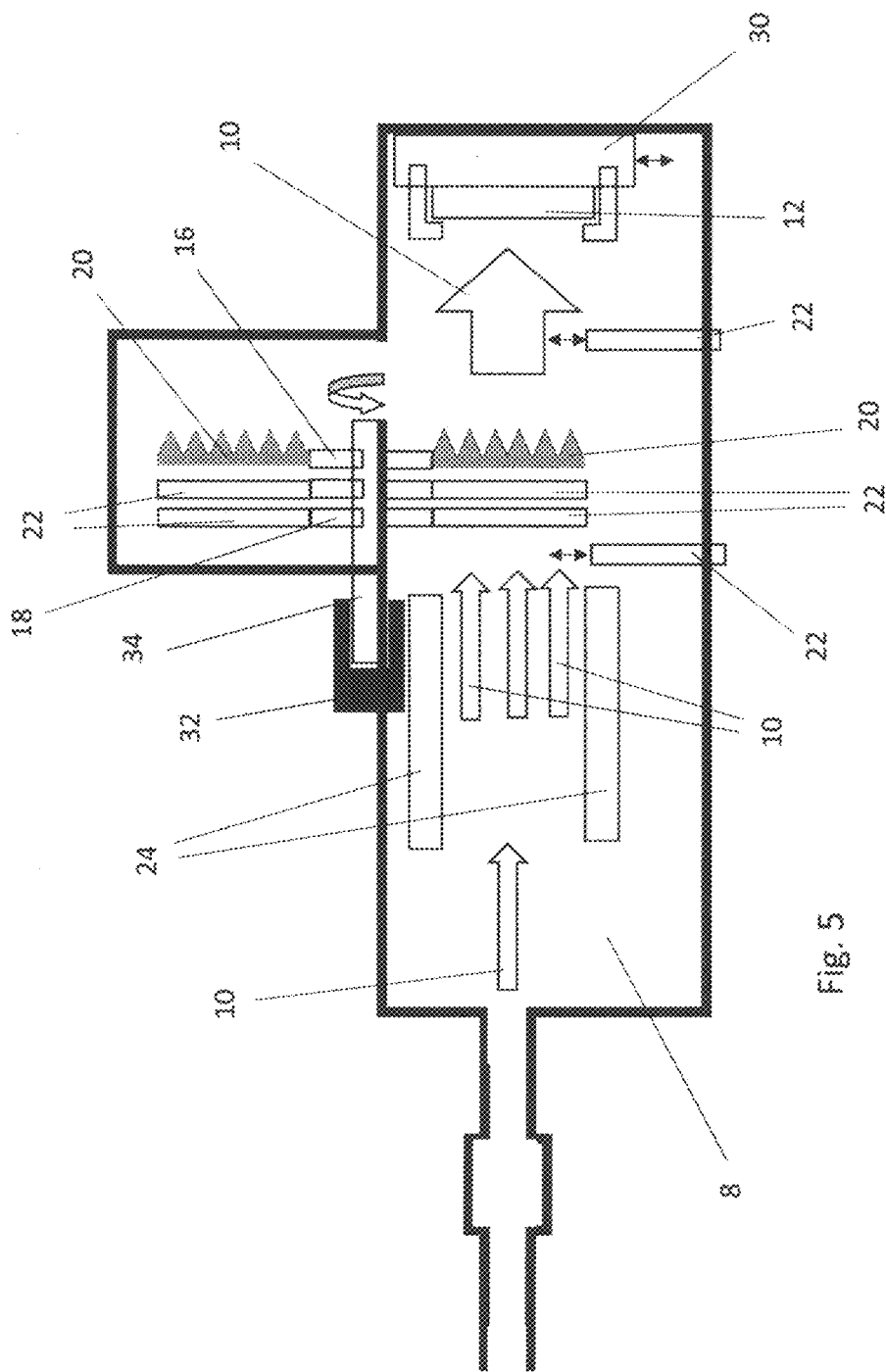
FIG. 5 is a schematic, cross-sectional view of another alternative embodiment of the device according to the invention for implanting particles in a substrate.

As can be seen in FIGS. 4 and 5, the substrate holder 30 does not have to be stationary. On the contrary, the substrate holder 30 can, as an option, be provided with a unit for moving the substrate 12 in the x-y direction (in the plane perpendicular to the plane of the page). A wafer wheel, on which the substrates 12 to be implanted are mounted and which rotates during the implantation, can also be considered. A displacement of the substrate holder 30 in the beam direction (z direction) is also possible. The substrate holder 30, furthermore, can be provided with a heater or a cooler as an option.

Figure 2:
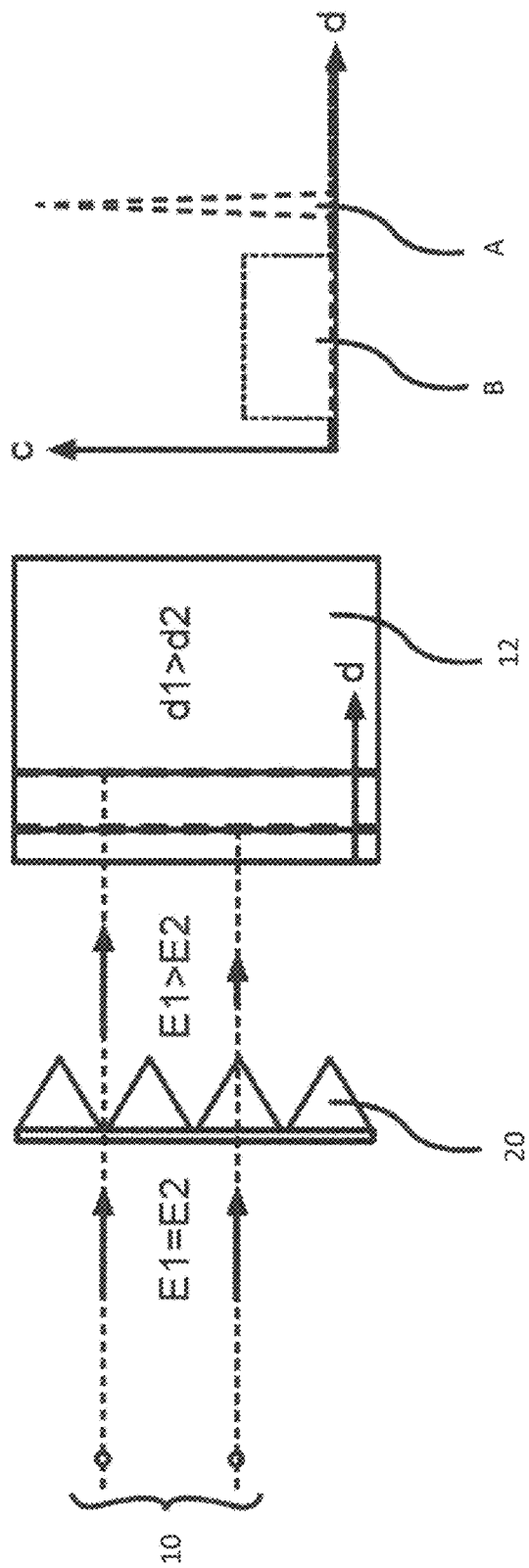
FIG. 2 is a schematic diagram of the way in which an energy filter, which can be used in the device according to FIG. 1, works.

The basic principle of the energy filter 20 is illustrated in FIG. 2. The energy of the mono-energetic ion beam 10 is modified as a function of the point of entry as it passes through the energy filter 20, which is configured as a microstructured membrane. The resulting energy distribution of the ions of the ion beam 10 leads to a modification of the depth profile of the implanted substance in the matrix of the substrate 12. E1 designates the energy of a first ion, E2 designates the energy of a second ion, c designates the dopant concentration, and d designates the depth in the substrate 12. On the right of the diagram, the standard Gaussian distribution is identified by the reference symbol A. This is the distribution which would occur without the use of an energy filter 20. In contrast, a rectangular distribution designated B, which can be obtained with the use of an energy filter 20, is shown by way of example.

Figure 3:
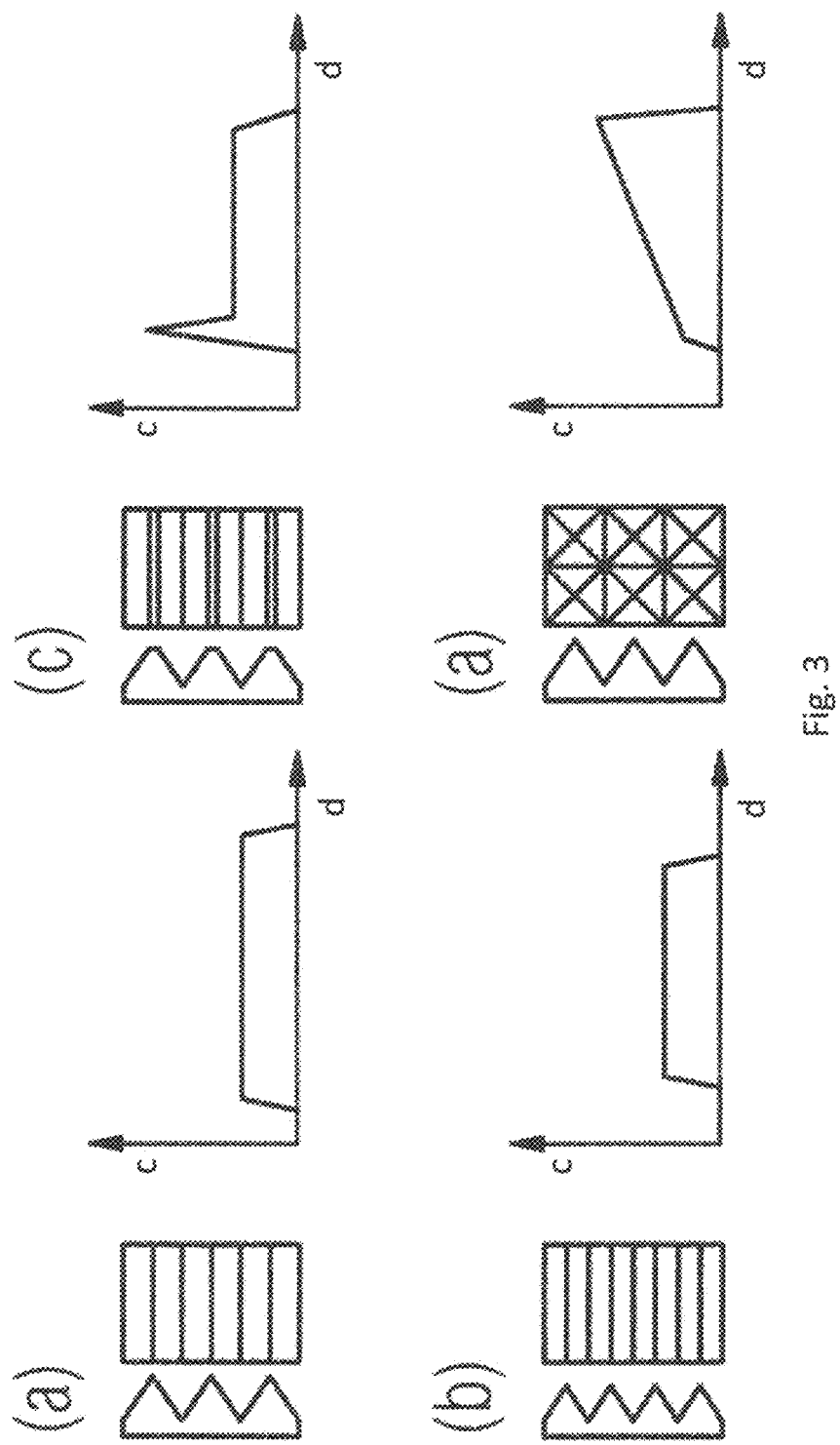
FIG. 3 is a schematic diagram of various doping profiles, which can be produced by means of various structured energy filters.

The layout or 3-dimensional structure of the energy filters 20 illustrated in FIG. 3 shows the principal possibilities of generating a plurality of dopant depth profiles or defect depth profiles by means of an energy filter 20. c designates again the dopant concentration, and d designates again the depth in the substrate 12. The filter structure profiles can in principle be combined with each other in order to obtain new filter structure profiles and thus new dopant depth profiles or defect depth profiles.

Energy filters 20 of this type are usually made of silicon. They have a thickness of between 3 µm and 200 µm, preferably of between 5 µm and 50 µm, and especially preferably of between 7 µm and 20 µm. They can be mounted in a filter frame (not shown). The filter frame can be mounted in a filter holder 16 (see FIG. 4) to allow easy replacement.

According to one aspect of the invention, at least one passive braking element 22 is arranged in the beamline of the ion beam 10. The braking element 22 is arranged between the particle accelerator 4 and the substrate holder 30 and is a certain distance away from the energy filter 20.

The passive braking element 22 preferably comprises a planar membrane of one of the following materials: silicon, tungsten, carbon, or titanium. Criteria for the choice of material include, for example, the possibility of producing thin membranes, the braking power of the material, the heat capacity or heat radiation capacity of the material, and the potential danger of contaminating the substrate 12.

The thickness of the planar membrane is between 0.5 µm and 100 µm, preferably between 2 µm and 30 µm, and more preferably between 4 µm and 15 µm.

Each braking element 22 can be mounted in a frame (not shown). The frame can be mounted in the holder 18 for ease of replacement (see FIG. 4).

In FIG. 1, precisely one passive braking element 22 is shown, which is arranged between the particle accelerator 4 and the energy filter 20 and preferably inside the irradiation chamber 8.

FIG. 4 shows part of an alternative embodiment of the device shown in FIG. 1. The same elements are designated by the same reference symbols. The explanations given in conjunction with FIG. 1 apply to the same individual elements, making any further remarks unnecessary. The explanations given in conjunction with FIG. 1 also apply to components not shown in FIG. 4.

Especially when, as described above, a particle accelerator 4 is used which delivers a pulsed ion beam 10, the ion beam 10 is preferably spread out in a beam spreader 24 before it strikes the braking element 22 or the energy filter 20.

In the embodiment shown in FIG. 4, several passive braking elements 22 are provided. As illustrated, the braking elements 22 can be arranged in front of or behind the energy filter 20 with respect to the beam direction and are usually mounted in holders 18.

Each of the braking elements 22 is spaced apart from the adjacent braking element 22 or spaced apart from the energy filter 20. The distance between two adjacent braking elements 22 or between a braking element 22 and the energy filter 20 is usually between 0.5 cm and 50 cm, preferably between 0.7 cm and 10 cm, and more preferably between 1 cm and 2 cm.

As shown in the case of the first and last braking elements 22, each individual passive braking element 22 can be supported so that it can move in a direction perpendicular to the beamline. In the case of the movable braking elements 22, the holders 18 are not shown for the sake of simplicity.

So that it is possible to vary the energy of the ion beam 10 striking the substrate 12 even though the energy of the ion beam 10 delivered by the particle accelerator 4 is fixed, it is now possible, for example, to vary the number of braking elements 22 through which the ion beam 10 passes after leaving the particle accelerator 4. Alternatively or in addition, the energy of the ion beam 10 striking the substrate 12 can be varied by an appropriate selection of properties such as the material and/or thickness of the braking element 22 or of the braking elements 22.

In concrete terms, all of the above-cited parameters must be set in such a way that the braking capacity of all the braking elements 22 and of the energy filter 20 in the beamline will be such that the energy of the ion beam 10 is reduced to the desired energy for the application in question (depth of the dopant profile or defect profile in the substrate 12). Together with the energy filter 20, the choice and configuration of the braking elements 22 are thus decisive in determining the primary energy of the ion beam 10 for the application in question, starting from the fixed energy per nucleon coming from the accelerator.

It is also possible to connect a passive braking element 28, which is preferably configured as a planar membrane layer, monolithically to the energy filter 20. Because energy filters 20 are usually made out of silicon, the braking element 28 is also preferably made out of silicon. Thus the distortion effects can be avoided which can be caused by the different thermal expansion behavior of different materials. Embodiments with combined energy filter 20 and braking element 28 are also conceivable, however, in which different materials are provided for the energy filter 20 and for the braking element 28. In such cases, it is possible for the energy filter 20 and the braking element 28 not to form a monolithic structure, although it would then be necessary to provide a mechanically strong connection with good heat conductivity between the energy filter 20 and the braking element 28.

The embodiment according to FIG. 5 corresponds in many aspects to the embodiment of FIG. 4. What is added is a device which makes it possible to rotate one or more braking elements 22 and/or one or more energy filters 20.

In this case, at least one braking element 22 and/or at least one energy filter 20 is mounted on a shaft 34, which is supported rotatably and which is driven by a rotational mechanism 32. Thus the braking element 22 in question and/or the energy filter 20 in question can be moved into or out of the beamline. A servomotor can be considered in particular as the drive component for the rotational mechanism 32.

In this embodiment, it is especially preferred that there be multiple copies, preferably identical copies, of the braking element 22, as shown, and that these braking elements 22 be rotated into the path of the ion beam 10 in alternation. In addition or as an alternative, there can also be several, preferably identical, energy filters 20 present, which are brought into the path of the ion beam 10 in alternation. The holders 16, 18 of the energy filters 20 and braking elements 22 can also be configured as a single, integral unit.

When a pulsed ion beam 10 is being used, the movement of the energy filters 20 and/or of the passive braking elements 22 is coordinated advantageously with the periodic time structure of the ion beam 10. This ensures that the ion pulse always strikes active areas of the energy filter 20 or of the braking elements 22, and also that the ion pulse is prevented from always striking the same spot on an energy filter 20 or on a braking element 22. The coordination can be achieved by one rotational movement per pulse or per several pulses in a range of, for example, one rotational movement per 10-20 pulses.

Generally speaking, the coordination of a pulsed ion beam 10 with rotating energy filters 20 and/or braking elements 22 should lead to the result that the energy filters 20 and/or the braking elements 22 are irradiated uniformly on average, that the energy input is distributed as uniformly as possible, and that the dead times attributable to inadvertently irradiated auxiliary or support structures of the energy filters 20 and/or of the braking elements 22 are avoided.

A rotational movement is necessary when the ion currents are very high and when there is a very large difference between the energy of the ion beam 10 on the accelerator side and that on the substrate side. In these cases, a braking element 22 and/or an energy filter 20 would heat up to a very pronounced degree. It is therefore necessary to increase the effective surface area which the ion beam 10 strikes on the accelerator side and/or to decrease the impinging current density.

For the dissipated power in a braking element 22 or in an energy filter 20, the following applies:

dissipated power (energy converted into heat in the element)=beam power minus transmitted power (residual power after passing through the element).

The alternating use of identical braking elements 22 and/or the alternating use of identical energy filters 20 is advisable at dissipated power values above 3 W/cm$^2$, preferably at values above 2 W/cm$^2$.

In this connection embodiments are also conceivable which make possible a linear movement of the energy filters 20 and/or of the braking elements 22 instead of a rotational movement.

One aspect according to the invention of the device is to be seen in using structured energy filters 20 together with unstructured braking elements 20 for the purpose of energy modification. This idea can be exploited to drastically simplify the particle accelerator 4, because the particle accelerator 4 can then be built in such a way that, for example, it needs to deliver only one fixed energy per nucleon. The target energy of the ion beam 10 required for a specific application is then set by subtracting the necessary amount of energy from the energy of the primary beam.

The number of braking elements 22 can vary in any of the above-described embodiments, as also their arrangement in space and their properties such as material and thickness. At least one braking element 22 must be present, which can be arranged in front of or behind the energy filter 20 with respect to the direction of the ion beam. Certain individual braking elements 22 selected from the above-described embodiments can also be used separately or in any desired combination with other braking elements 22 according to other embodiments.

When multiple braking elements 22 are present, the individual braking elements 22 can have different properties, or they can all have an identical configuration.

The braking elements 22 and/or the energy filters 20 can also be movable in the beam direction, either individually or relative to each other or jointly as an entire group.

In all of the embodiments, the braking elements 22 and energy filters 20 can also be arranged in a separate vacuum chamber which can be sealed off by valves. The vacuum chamber is arranged inside the irradiation chamber 8 or is connected directly to it.

The invention claimed is:

1. A device for implanting particles in a substrate, comprising:
   a particle source and a particle accelerator for generating an ion beam of positively charged ions;
   a substrate holder;
   an energy filter arranged between the particle accelerator and the substrate holder, wherein the energy filter is a microstructured membrane with a predefined structural profile for setting a dopant depth profile and/or a defect depth profile produced in the substrate by the implanting; and
   at least one passive braking element for the ion beam, wherein the passive braking element is arranged between the particle accelerator and the substrate holder and is spaced apart from the energy filter,
   wherein the particle accelerator is a high-frequency linear accelerator or a cyclotron, and
   wherein
      the particle accelerator has a configuration which allows it to deliver only one fixed energy per nucleon for each ion species, or
      the particle accelerator has a configuration which allows it to deliver only ions in an energy range of 1 to 50 MeV, and the particle accelerator has a configuration according to which only fewer than ten settable energies of the ion beam are possible.

2. The device of claim 1, wherein the at least one passive braking element comprises a planar membrane.

3. The device of claim 2, wherein the thickness of the planar membrane is between 2 µm and 30 µm.

4. The device of claim 2, wherein the material of the planar membrane is selected from one of the following materials: silicon, tungsten, carbon, titanium.

5. The device of claim 1, wherein the at least one passive braking element is arranged between the particle accelerator and the energy filter.

6. The device of claim 1, wherein the at least one passive braking element is supported pivotably or slidably.

7. The device of claim 1, wherein the particle accelerator generates a pulsed or continuous ion beam with an energy of 1.0 to 2.0 MeV/nucleon.

8. The device of claim 1, wherein holders of the energy filter and of the at least one passive braking element are configured as a single integral unit.

9. The device of claim 1, wherein the at least one passive braking element and the energy filter are arranged in a separate vacuum chamber which is configured to be sealed off by valves, wherein the vacuum chamber is arranged inside an irradiation chamber, in which the substrate holder and substrate are arranged, or connected directly to the irradiation chamber.

10. The device of claim 1, wherein the at least one passive braking element is arranged behind the energy filter with respect to a direction of the ion beam.

11. A method for implanting particles in a substrate by means of a device for implanting particles in the substrate, the device comprising:
   a particle source and a particle accelerator for generating an ion beam of positively charged ions;
   a substrate holder;
   an energy filter arranged between the particle accelerator and the substrate holder, wherein the energy filter is a microstructured membrane with a predefined structural profile for setting a dopant depth profile and/or a defect depth profile produced in the substrate by the implanting; and
   at least one passive braking element for the ion beam, wherein the passive braking element is arranged between the particle accelerator and the substrate holder and is spaced apart from the energy filter,
   wherein the particle accelerator is a high-frequency linear accelerator or a cyclotron, and
   wherein
      the particle accelerator has a configuration which allows it to deliver only one fixed energy per nucleon for each ion species, or
      the particle accelerator has a configuration which allows it to deliver only ions in an energy range of 1 to 50 MeV, and the particle accelerator has a configuration according to which only fewer than ten settable energies of the ion beam are possible,
   the method comprising the steps of:
      generating an ion beam of positively charged ions by means of the particle source and the particle accelerator; and
      irradiating the substrate held by the substrate holder with the ion beam under interposition of the at least one passive braking element and the energy filter,
   wherein an energy of the ion beam striking the substrate is varied by use of an appropriate selection of a quantity of the at least one passive braking element, through which the ion beam passes after leaving the particle accelerator, and an appropriate selection of material and/or thickness of the at least one passive braking element.

12. The method of claim 11, wherein the at least one passive braking element is provided in multiple copies, and wherein the copies of the at least one passive braking element are alternately rotated into the path of the ion beam.

13. The method of claim 12, wherein multiple energy filters are provided, which are alternately moved into the path of the ion beam, wherein the energy filters and the passive braking elements are driven by a same rotational mechanism.

14. The method of claim 11,
   wherein the high-frequency linear accelerator or the cyclotron generates a pulsed or continuous ion beam with an energy of 0.3 to 3.0 MeV/nucleon.

15. The method of claim 14, wherein a pulse duty factor of the pulsed ion beam is in a range from 1:20 to 1:5.

16. The method of claim 14, wherein the ion beam is spread out before striking the at least one passive braking element.

17. A device for implanting particles in a substrate, comprising:
- a particle source and a particle accelerator for generating an ion beam of positively charged ions;
- a substrate holder;
- an energy filter arranged between the particle accelerator and the substrate holder, wherein the energy filter is a microstructured membrane with a predefined structural profile for setting a dopant depth profile and/or a defect depth profile produced in the substrate by the implanting; and
- at least one passive braking element for the ion beam, wherein the passive braking element is arranged between the particle accelerator and the substrate holder and is spaced apart from the energy filter;
- wherein the at least one passive braking element and the energy filter are arranged in a separate vacuum chamber which is configured to be sealed off by valves, wherein the vacuum chamber is arranged inside an irradiation chamber, in which the substrate holder and substrate are arranged, or connected directly to the irradiation chamber.

\* \* \* \* \*